(12) United States Patent
Krijn et al.

(10) Patent No.: US 6,329,659 B1
(45) Date of Patent: Dec. 11, 2001

(54) CORRECTION DEVICE FOR CORRECTING THE LENS DEFECTS IN PARTICLE-OPTICAL APPARATUS

(75) Inventors: Marcellinus PC. M. Krijn; Sjoerd A. M. Mentink, both of Eindhoven (NL)

(73) Assignee: Philips Electron Optics B.V., Eindhoven (NL)

( * ) Notice: Subject to any disclaimer, the term of this patent is extended or adjusted under 35 U.S.C. 154(b) by 0 days.

(21) Appl. No.: 09/367,176
(22) PCT Filed: Dec. 10, 1998
(86) PCT No.: PCT/IB98/01977
§ 371 Date: Aug. 9, 1999
§ 102(e) Date: Aug. 9, 1999
(87) PCT Pub. No.: WO99/30343
PCT Pub. Date: Jun. 17, 1999

(30) Foreign Application Priority Data

Dec. 11, 1997 (EP) ................................................. 97203891

(51) Int. Cl.[7] .................................................. H01J 37/145
(52) U.S. Cl. .............................. 250/396 R; 250/396 ML; 250/398; 250/311
(58) Field of Search ...................... 250/396 R, 396 ML, 250/398, 311

(56) References Cited

U.S. PATENT DOCUMENTS

| 4,590,379 | 5/1986 | Martin ............................... 250/396 R |
| 4,962,313 | 10/1990 | Rose ............................... 250/396 ML |
| 5,084,622 | 1/1992 | Rose ................................... 250/396 |
| 5,838,011 | 11/1998 | Krijn et al. ..................... 250/396 ML |
| 6,191,423 | 2/2001 | Krijn et al. ..................... 250/396 ML |
| 6,236,052 | 5/2001 | Krijn .............................. 250/396 ML |
| 6,246,058 | 6/2001 | Tiemeijer .......................... 250/396 R |

FOREIGN PATENT DOCUMENTS

WO9812732  3/1998  (WO) ............................ H01J/37/153

OTHER PUBLICATIONS

"Design of a high–resolution low–voltage scanning electron Microscope", J. Zach, Optik 83, No. 1, 1989, pp. 30–40.

*Primary Examiner*—Bruce Anderson

(57) ABSTRACT

Electron-optical rotationally symmetrical lenses inevitably suffer from spherical and chromatic aberration which often impose a limit on the resolution. These lens defects cannot be eliminated by compensation by means of rotationally symmetrical fields. In order to enhance the resolution nevertheless, it has already been proposed to correct the spherical aberration by means of a correction device provided with two hexapoles (24, 26) and two rotationally symmetrical transmission lens systems (28, 30). Each transmission lens system in the known correction device consists of two lenses. According to the invention, one or both transmission lens systems can be replaced by a respective system (46) of four quadrupoles (48, 50, 52, 54), without the correction capability being reduced or only hardly so. If the two central quadrupoles (50, 52) of the quadrupole system (46) forming part of the correction device (22) are also arranged to produce electric quadrupole fields, the chromatic aberration of the lens to be corrected can also be corrected.

6 Claims, 4 Drawing Sheets

CORRECTION DEVICE FOR CORRECTING THE LENS DEFECTS IN PARTICLE-OPTICAL APPARATUS

FIELD OF THE INVENTION

The invention relates to a particle-optical apparatus which includes a particle source for producing a beam of electrically charged particles which travel along an optical axis of the apparatus in order to irradiate an object to be irradiated in the apparatus by means of the particle beam, a focusing lens for focusing the beam of electrically charged particles, and a correction device for correcting lens defects of the focusing lens, which correction device includes a correction unit which is provided with at least two hexapoles wherebetween a first imaging transmission system is arranged in order to image one hexapole onto the other hexapole, and which correction device also includes a second transmission system for imaging a coma-free plane of the focusing lens onto the entrance of the correction unit.

The invention also relates to a correction device for use in such an apparatus.

DESCRIPTION OF PRIOR ART

A correction device of this kind for use in such an apparatus is known from U.S. Pat. No. 5,084,622.

Generally speaking, particle-optical apparatus, such as electron microscopes or electron lithography apparatus, are arranged to irradiate an object to be studied or treated by means of a beam of electrically charged particles (usually an electron beam) which is produced by means of a particle source such as a thermal electron source or an electron source of the field emission type. The irradiation of the object may be aimed at imaging the objects to be studied in such apparatus (specimens in electron microscopes) or at forming very small structures on the object, for example for micro-electronics (electron lithography apparatus). In both cases focusing lenses are required to focus the electron beam.

The electron beam can in principle be focused in two ways. According to the first method, a specimen to be examined is more or less uniformly irradiated by the electron beam and an enlarged image of the specimen is formed by means of the focusing lens. The focusing lens is in that case the objective lens of an imaging lens system; the resolution of the objective lens then decides the resolution of the apparatus. Apparatus of this kind are known as Transition Electron Microscopes (TEM). According to a second focusing method, the emissive surface of the electron source, or a part thereof, is imaged, usually at a strongly reduced scale, on the specimen to be examined (in the Scanning Electron Microscope or SEM or in the Scanning Transmission Electron Microscope or STEM) or on an object on which the relevant microstructure is to be provided (in the lithography apparatus). The image of the electron source (the "spot" which is displaced across the object by means of, for example deflection coils) is again formed by means of an imaging lens system. In the latter case the focusing lens is formed by the objective lens of the spot forming lens system; the resolution of this objective lens decides the spot size of the beam and hence the resolution of the apparatus.

The lenses used in all apparatus of this kind are usually magnetic lenses, but may also be electrostatic lenses. Both types of lens are practically always rotationally symmetrical. Such lenses inevitably have a non-ideal behavior, i.e. they have lens defects, among which the so-called spherical aberration and the chromatic aberration are usually decisive in respect of the resolution of the lens; these lens defects thus determine the limit of the resolution of the known electron optical apparatus. According to a theorem of particle optics, such lens defects cannot be eliminated by compensation by means of rotationally symmetrical electrical or magnetic fields.

In order to enhance the resolution of the particle-optical apparatus nevertheless, it is known from the cited U.S. Pat. No. 5,084,622 to reduce said lens defects by means of a correction device having a structure which is not rotationally symmetrical. In such a structure a coma-free plane of the focusing lens to be corrected is imaged onto the entrance of the correction unit by means of a transmission lens system consisting of rotationally symmetrical lenses. This correction unit is formed by two hexapoles wherebetween there is arranged an imaging transmission lens system which consists of rotationally symmetrical lenses and serves to image one hexapole onto the other. The entrance of the correction unit is then formed by the center of the first hexapole, viewed in the direction of the incident electrons.

A configuration of this kind must satisfy severe requirements as regards manufacturing tolerances, mechanical stability (inter alia with a view to thermal drift) and alignment of the various elements relative to one another. Therefore, the aim is to minimize the number of separate structural components so that the requirements as regards manufacturing tolerances, mechanical stability and alignment can be satisfied as easily as possible.

SUMMARY OF THE INVENTION

It is an object of the invention to provide a correction device for correcting lens defects whose construction is simpler than that of the known correction device. To this end, the particle-optical apparatus according to the invention is characterized in that the first transmission system consists of at least four quadrupoles having substantially equal quadrupole strengths, the quadrupole effects of neighboring quadrupoles each time being directed perpendicularly to one another.

The invention is based on the recognition of the fact that the severe requirements imposed in respect of the resolution of such a correction device can be satisfied by means of a transmission system which is constructed in the form of four quadrupoles instead of a transmission lens system constructed as a doublet of round lenses. Using such a configuration, the spherical aberration of the objective can be corrected to a high degree. Taking these steps offers a number of advantages. First of all, as opposed to rotationally symmetrical lenses, the images formed by an imaging quadrupole system are rotation-free relative to the imaged object. This facilitates the adjustment and alignment of the entire optical system of the particle-optical apparatus. Secondly, quadrupoles are so-called strong lenses, which means that for a given focal distance a much smaller energizing current is required in comparison with corresponding rotationally symmetrical (round) lenses. This offers the advantage that the cooling of such quadrupoles is much easier than that of round lenses, and that thermal drift of a particle-optical apparatus which is not in a state of thermal equilibrium is strongly reduced.

In a preferred embodiment of the invention, the second transmission system consists of at least four quadrupoles having substantially equal quadrupole strength, the quadrupole effects of neighboring quadrupoles each time being directed perpendicularly to one another. The quadrupoles in the second transmission system then yield the same advantages as the quadrupoles in the correction unit.

In a further embodiment of the invention, the two hexapoles of the correction unit are substantially identical. This results in a high degree of symmetry of the correction unit, so that the correction unit is particularly suitable for a SEM (in which the electrons travel through the correction unit to the lens to be corrected) as well as for a TEM (in which the electrons travel through the lens to be corrected to the correction unit).

In a further embodiment of the invention, each of the two hexapoles is constructed as a hexapole doublet. An axial shift of the centers of the hexapoles can thus be realized without physical displacement of these elements; this makes it easier to satisfy the requirements imposed as regards mechanical precision and alignment.

In a further embodiment of the invention, the central quadrupoles of the first transmission system are constructed as a multipole unit having at least eight physical poles, at least four of which can be adjusted to an electric potential in a mutually independent manner. When the electric voltages on the poles are suitably chosen, an electric quadrupole field is formed; an additional magnetic quadrupole field is also produced. These two fields, i.e. the electric field and the additional magnetic field, are superposed on the magnetic quadrupole field present for the correction of the spherical aberration. Thus, this embodiment is suitable not only for correcting the spherical aberration but also the chromatic aberration of the objective of the particle-optical apparatus.

In a further embodiment of the invention, at least one of the quadrupoles of the first and/or the second transmission system and/or at least one of the hexapoles of the correction unit is constructed as a multipole unit having at least eight physical poles which can be energized in a mutually independent manner. The desired quadrupole fields and hexapole fields in this embodiment are realized by specific energizing of the physical poles. In this embodiment not only the desired quadrupole and hexapole fields can be generated, but it is also possible to correct for a variety of parasitic symmetries with a higher-order symmetry which occur as octupole, ten-pole or twelve-pole fields. Moreover, this step offers the advantage that only one physical component need be manufactured and kept in store, so that significant manufacturing and organizational advantages are achieved.

BRIEF DESCRIPTION OF THE DRAWING

The invention will be described in detail hereinafter with reference to the Figures in which corresponding reference numerals denote corresponding elements. Therein.

DETAILED DESCRIPTION OF THE PREFERRED

Figure 1:
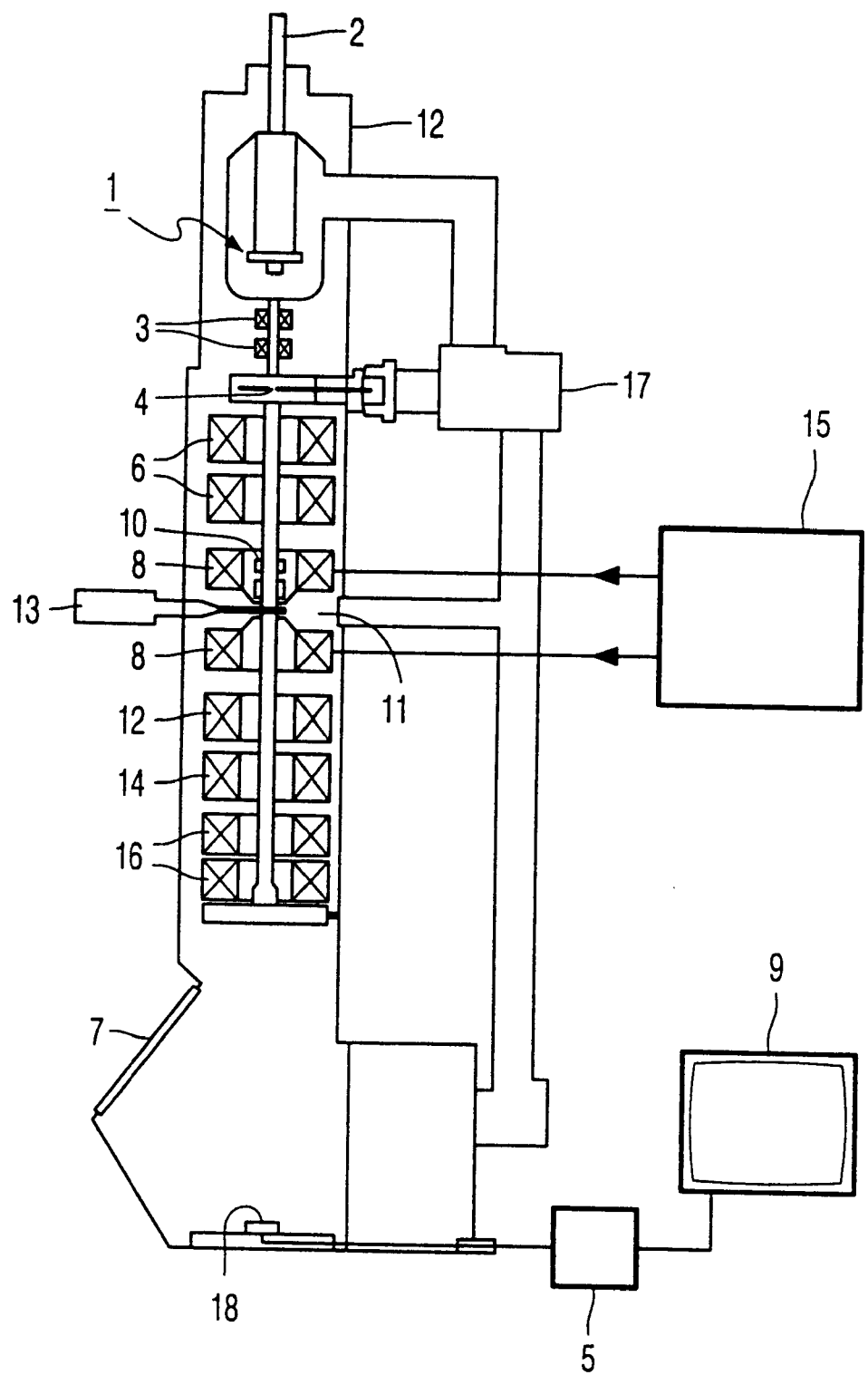
FIG. 1 is a diagrammatic cross-sectional view of a particle-optical apparatus in the form of an electron microscope in which the invention can be used.

FIG. 1 shows a particle-optical apparatus in the form of an electron microscope. The apparatus includes an electron source 1, a beam alignment system 3 and a beam diaphragm 4, a condenser lens 6, an objective lens 8, a beam scanning system 10, an object space 11 with a specimen holder 13, a diffraction lens 12, an intermediate lens 14, a projection lens 16 and an electron detector 18. The objective lens 8, the intermediate lens 14 and the projection lens 16 together constitute an imaging lens system. These elements are accommodated in a housing provided with an electric supply lead 2 for the electron source, a viewing window 7 and a vacuum pumping device 17. The energizing coils for the objective lens 8 are connected to a control unit 15 which is arranged to control the energizing of the imaging lens system. The electron microscope also includes a recording unit with the electron detector 18, an image processing unit 5 and a video display 9 for observing the images formed.

Figure 2:
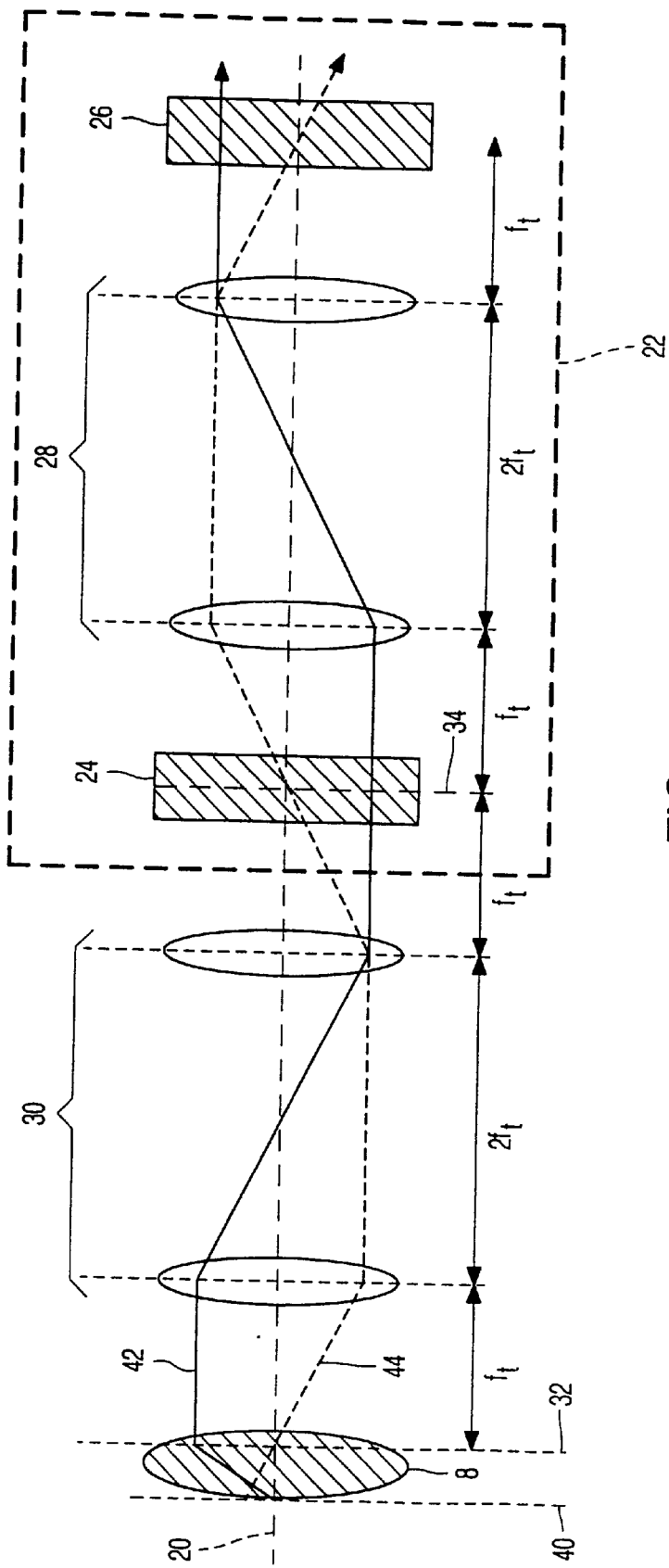
FIG. 2 shows a known correction device for correcting the spherical aberration in an electron microscope.

FIG. 2 shows a correction device as known from the cited U.S. Pat. No. 5,084,622 for correcting the spherical aberration in an electron microscope. This correction device includes a correction unit 22 which is provided with two identical hexapoles 24 and 26 wherebetween there is situated an imaging transmission lens system 28 for imaging the hexapoles 24 and 26 onto one another with a magnification −1.

It is to be noted that the correction device shown in FIG. 2 and the correction devices according to the invention can be used in a TEM as well as in a SEM or a STEM. In the case of a TEM, the electrons first pass through the objective 8 and subsequently through the correction device; in the Figure they then travel from left to right. In the case of a SEM or a STEM, the electrons first pass through the correction device and subsequently through the objective 8; in that case they travel from right to left in the Figure. In FIG. 2, like in the FIG. 3 yet to be described, it is assumed that the electrons travel from left to right.

The focusing lens for focusing the electron beam is in this case the objective 8 of a TEM to be corrected. The objective 8 has a coma-free plane 32 which is imaged onto the entrance plane 34 of the correction unit 22 by a second transmission lens system 30. The system 30 is necessary because the coma-free plane is situated in the magnetic field of the objective so that it could not coincide with the entrance plane 34 which is coincident with the central plane of the hexapole 24. All lenses of the two transmission lens systems 28 and 30 of the known correction device have a focal distance $f_t$. The distances between the various components are as follows. The distance between the objective and the adjoining lens of the system 30 is $f_t$; the distance between the two lenses of the system 30 is $2f_t$; the distance between the entrance plane 34 and the adjoining lens of the system 30 is $f_t$; the distance between the entrance plane 34 and the adjoining lens of the system 28 is $f_t$; the distance between the two lenses of the system 28 is $2f_t$; and the distance between the hexapole 26 and the adjoining lens of the system 28 is $f_t$. The Figures show the path of two electron rays from the object plane 40 through the transmission lens system 30 and the correction unit 22. One ray 42 extends from a point on the axis in the object plane, whereas the other ray 44 extends from a point in the object plane which is not situated on the axis. The paths of the rays 42 and 44 clearly show that the coma-free plane 32 is imaged onto the entrance of the correction unit 22 by the system 30, and that the center of the hexapole 24 is imaged onto the center of the hexapole 26 by the system 28.

Figure 3:
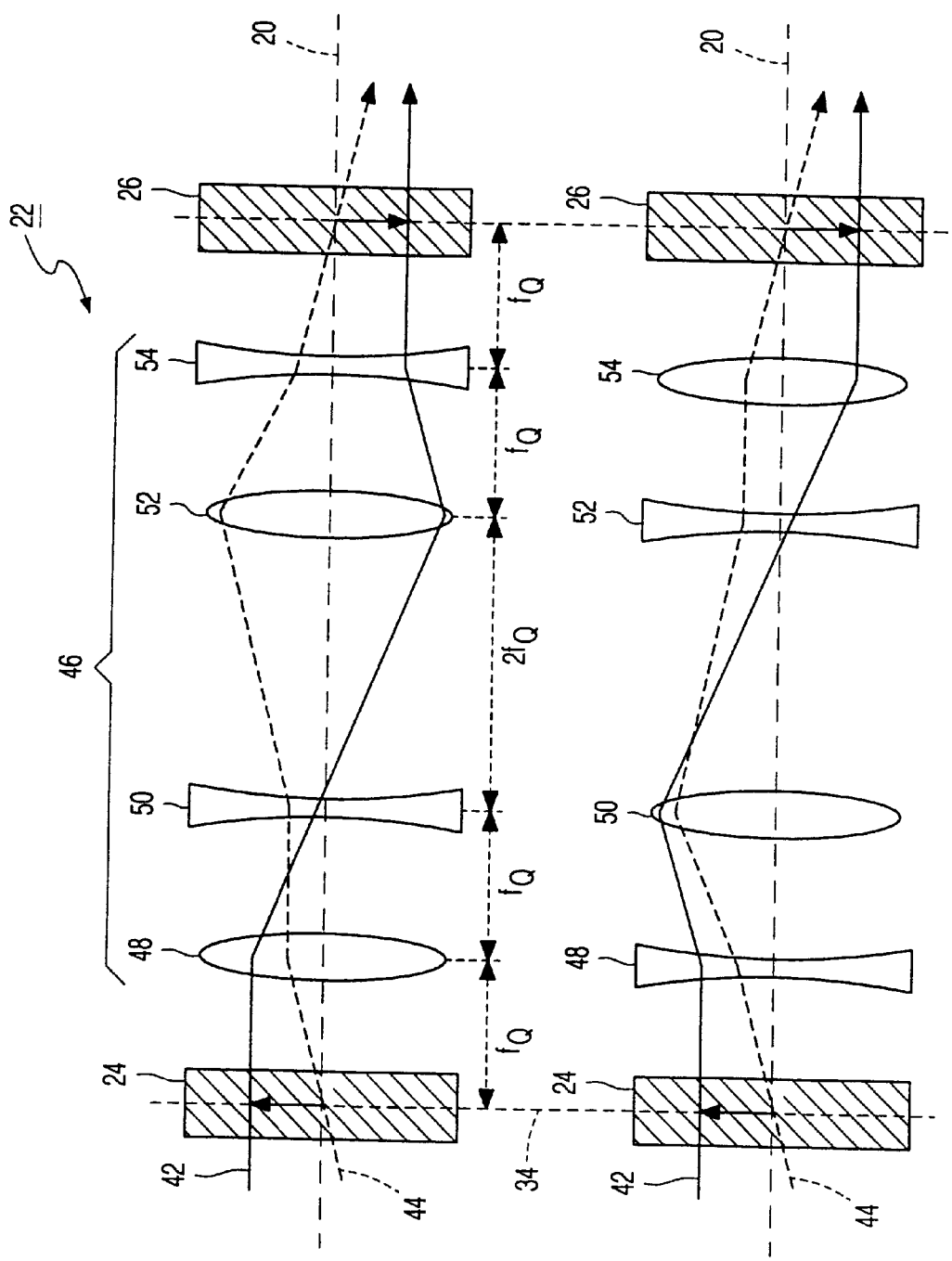
FIG. 3 is a diagrammatic representation of the elements in a correction device according to the invention for correcting lens defects in an electron microscope.

FIG. 3 shows a correction unit 22 according to the invention. In this correction unit the transmission lens system 28 has been replaced by a system 46 comprising four identical magnetic quadrupoles 48, 50, 52 and 54. In this Figure the quadrupoles are shown in the x-z plane (upper part of the Figure) as well as in the y-z plane (lower part of the Figure) as can be deduced from the illustrations of the various lens effects: a quadrupole which converges in the x-z plane diverges in the y-z plane and vice versa.

Neighboring quadrupoles in the system 46 always extend perpendicularly to one another, i.e. the quadrupole 48 extends perpendicularly to the quadrupole 50 which itself extends perpendicularly to the quadrupole 52; the latter quadrupole extends perpendicularly to the quadrupole 54 again. Each quadrupole in the system 46 has a focal distance $f_Q$. The distance between the first hexapole 24 (i.e. the entrance plane 34 of the correction unit 22) and the first quadrupole 48 equals $f_Q$, like the distance between the first quadrupole 48 and the second quadrupole 50, between the third quadrupole 52 and the fourth quadrupole 54, and between the second hexapole 26 and the fourth quadrupole 54. The distance between the second quadrupole 50 and the third quadrupole 52 equals $2f_Q$.

It appears from the paths of the ray 42, originating from a point on the axis in the object plane, and of the ray 44, originating from a point in the object plane outside the axis, that the hexapole 24 is imaged onto the hexapole 26 with a magnification −1, and vice versa.

The transmission lens system 30 shown in FIG. 2 can also be replaced by a system consisting of four identical magnetic quadrupoles such as the system 46. In that case the distance between the coma-free plane 32 of the objective 8 and the first quadrupole 48 equals $f_Q$, like the distance between the fourth quadrupole 54 and the entrance 34 of the 30 correction unit 22. The quadrupoles of the transmission system between the objective 8 and the correction unit 2 have a focal distance $f_Q$ which may (but need not) be equal to the focal distance $f_Q$ of the quadrupoles in the transmission system forming part of the correction unit 22. In that case the other distances in the transmission system between the objective 8 and the correction unit 22 are in that case the same as those in the correction unit 22.

The configuration shown in FIG. 3 also enables correction of the chromatic aberration of the objective lens 8. To this end, the quadrupoles 50 and 52 of the system 46 must generate an electric quadrupole field and an additional magnetic quadrupole field (both fields extending perpendicularly to the optical axis). The electric quadrupole field is then rotated through 45° relative to the magnetic quadrupole field; the so-called Wien condition must then be satisfied, i.e. for an electron of velocity v the force exerted on the electron by the magnetic field must be equal to but opposed to the force exerted by the electric field, so the condition E=B×v must be satisfied (B=additional magnetic quadrupole field strength and E=electric field strength). The correction of chromatic aberration while using such a system is known per se, i.e. from an article by J. Zach: "Design of a high-resolution low-voltage scanning electron microscope", in "Optik", Vol. 83, No. 1 (1989), pp. 30–40.

Figure 4:
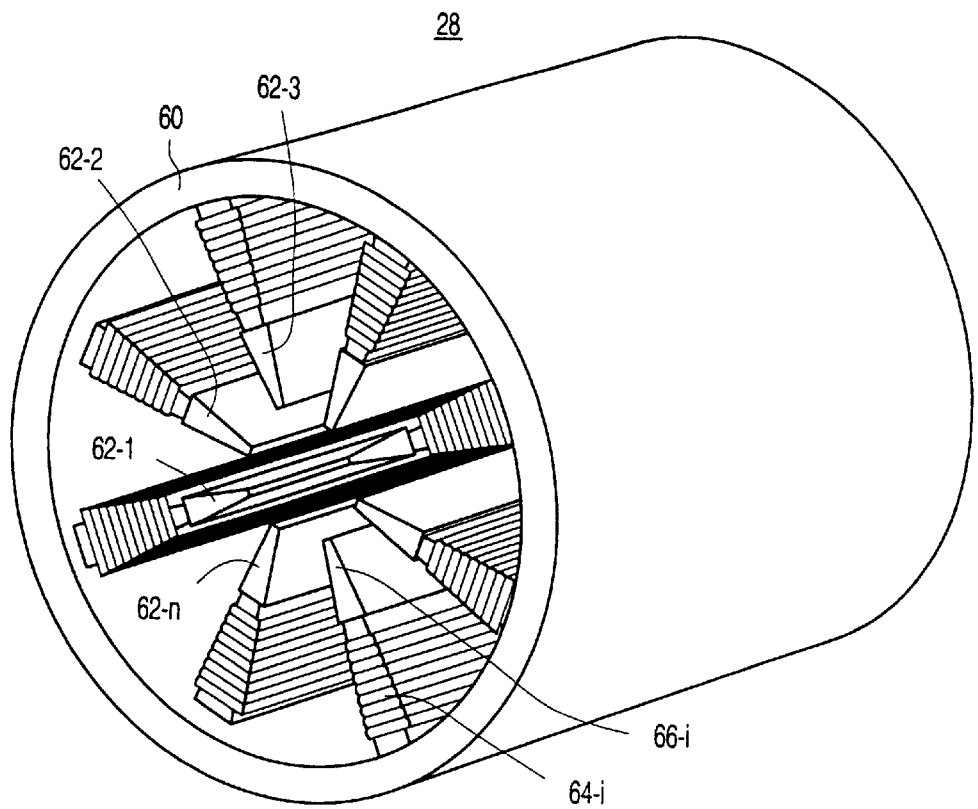
FIG. 4 shows an embodiment of a correction device for correcting the spherical and/or chromatic aberration in an electron microscope according to the invention.

FIG. 4 is a perspective view of an embodiment of a multipole device for use in a correction device intended for use in a particle optical instrument. The multipole device is formed by a magnetic circuit which consists of a cylindrical surface 60 in which a number of n poles 62-1 to 62-n is provided so as to be uniformly distributed across the cylinder, n being equal to 8 in this Figure. Even though this embodiment of the invention in principle does not require multipole fields of an order higher than hexapoles, for the compensation of mechanical imperfections it is desirable to have the possibility of generating also higher-order fields, for example n=8 as in this Figure, but n=10 or n=12 are also feasible and sometimes even desirable. When the correction device is used for forming a quadrupole system for the correction of spherical as well as chromatic aberration (so for the formation of a magnetic quadrupole field and an electric quadrupole field rotated through 45° with respect thereto), the number of physical poles should at least be eight. When the correction device is suitably aligned, the cylinder axis of the surface 60 should coincide with the optical axis of the particle-optical instrument shown in FIG. 1.

The various multipole fields, i.e. the magnetic as well as the electrostatic fields, are generated by means of the n poles. Each of these poles is arranged to generate an electric field as well as a magnetic field; the pole surfaces which determine said multipole fields extend parallel to the optical axis of the apparatus. Each pole 62-$i$ is provided with an energizing coil 64-$i$ for generating a magnetic field and with a pole cap 66-$i$ for generating an electric field. Each of the energizing coils 64-$i$ and each of the pole caps 66-$i$ can be individually energized, so that any desired multipole field, electric as well as magnetic, can be generated by means of the eight poles 62-1 to 62-8. This holds for the quadrupoles 48, 50, 52 and 54 as well as for the hexapoles 24 and 26. It is to be noted that the described correction device is described in detail in the published European patent application No. 0 868 739 (=U.S. Ser. No. 08/932,981=PHN 15.991) previously filed by Applicant.

Figure 5:
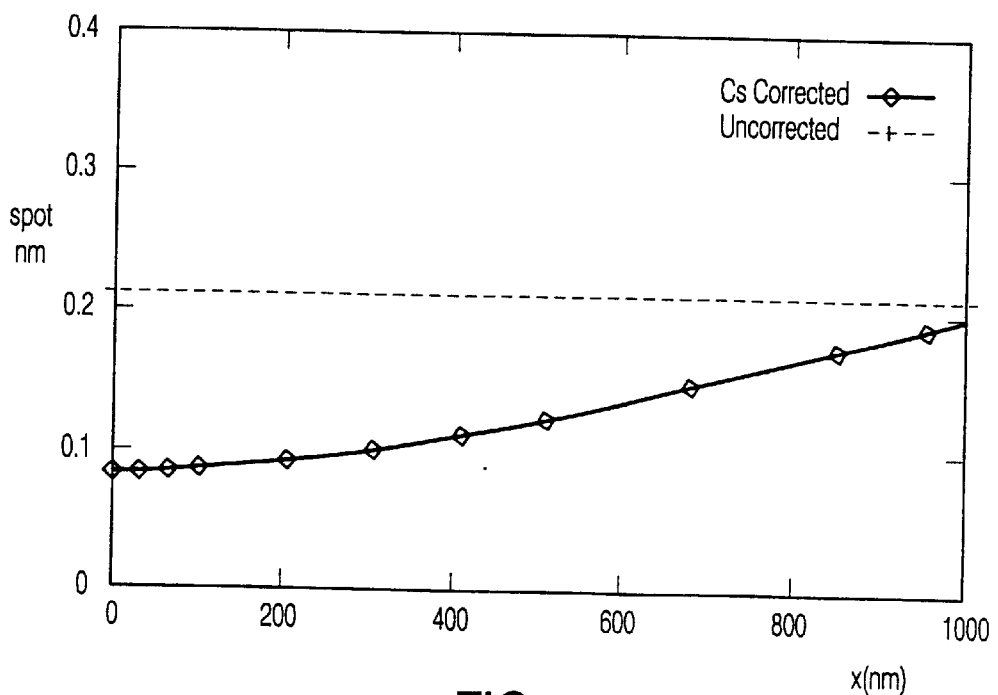
FIG. 5 shows graphically the effect of the correction of the spherical aberration in a SEM.

FIG. 5 graphically illustrates the effect of the correction of the spherical aberration in a STEM. In this Figure the dimensions of a scan spot on the specimen are plotted vertically in nanometers and the distance between the scan spot on the specimen and the optical axis is plotted horizontally, again in nanometers. The dashed line represents the situation in which the spherical aberration of the objective is not corrected and the solid line represents the situation in which correction of the spherical aberration of the objective is applied according to the invention. This Figure clearly shows that a substantial improvement of the spot size, and hence of the resolution of the particle-optical apparatus, is achieved across the entire zone of interest of the specimen.

What is claimed is:

1. A particle-optical apparatus which comprises:
   a particle source (1) for producing a beam of electrically charged particles which travel along an optical axis of the apparatus in order to irradiate an object (13) to be irradiated in the apparatus by means of the particle beam,
   a focusing lens (8) for focusing the beam of electrically charged particles,
   and a correction device for correcting lens defects of the focusing lens (8),
      said correction device includes a correction unit (22) which is provided with at least two hexapoles (24, 26) wherebetween a first imaging transmission system (28) is arranged in order to image one hexapole onto the other hexapole, and
   said correction device also includes a second transmission system (30) for imaging a coma-free plane (32) of the focusing lens onto the entrance of the correction unit, characterized in that the first transmission system (28) consists of at least four quadrupoles (48, 50, 52, 54) having substantially equal quadrupole strengths, the quadrupole effects of neighboring quadrupoles (48, 50; 50, 52; 52, 54) each time being directed perpendicularly to one another.

2. A particle-optical apparatus as claimed in claim 1, in which the second transmission system (30) consists of at least four quadrupoles having substantially equal quadrupole strengths, the quadrupole effects of neighboring quadrupoles each time being directed perpendicularly to one another.

3. A particle-optical apparatus as claimed in claim 1, in which the two hexapoles (24, 26) are substantially identical.

4. A particle-optical apparatus as claimed in claim 1, in which each of the two hexapoles (24, 26) is constructed as a hexapole doublet.

5. A particle-optical apparatus as claimed in claim 1, in which the central quadrupoles of the first transmission system are constructed as a multipole unit having at least eight physical poles, at least four of which can be adjusted to an electric potential in a mutually independent manner.

6. A particle-optical apparatus as claimed in claim 1, in which at least one of the quadrupoles of the first and/or the second transmission system and/or at least one of the hexapoles of the correction unit (22) is constructed as a multipole unit having at least eight physical poles which can be energized in a mutually independent manner.

* * * * *